United States Patent

Kushiya et al.

[11] Patent Number: 6,048,442
[45] Date of Patent: Apr. 11, 2000

[54] METHOD FOR PRODUCING THIN-FILM SOLAR CELL AND EQUIPMENT FOR PRODUCING THE SAME

[75] Inventors: Katsumi Kushiya; Muneyori Tachiyuki; Takahisa Kase, all of Tokyo, Japan

[73] Assignee: Showa Shell Sekiyu K.K., Tokyo, Japan

[21] Appl. No.: 08/841,688

[22] Filed: Apr. 30, 1997

[30] Foreign Application Priority Data

Oct. 25, 1996 [JP] Japan .................................... 8-299797

[51] Int. Cl.[7] .................................................. C23C 14/34
[52] U.S. Cl. ............................... 204/192.28; 204/192.26; 204/192.15; 204/298.13; 204/298.26; 438/95; 427/76
[58] Field of Search ..................... 204/192.26, 298.18, 204/192.15, 298.13, 298.26; 136/262, 265; 438/95; 427/76

[56] References Cited

U.S. PATENT DOCUMENTS

| | | | |
|---|---|---|---|
| 3,985,635 | 10/1976 | Adam et al. | 204/298 |
| 4,335,266 | 6/1982 | Mickelsen et al. | |
| 4,465,575 | 8/1984 | Love et al. | 204/192 |
| 4,798,660 | 1/1989 | Ermer et al. | |
| 4,915,745 | 4/1990 | Pollock et al. | |
| 5,439,575 | 8/1995 | Thornton et al. | 204/192.25 |
| 5,445,973 | 8/1995 | Hedstrom | 437/5 |

FOREIGN PATENT DOCUMENTS 4-326526  11/1992  Japan .

OTHER PUBLICATIONS

Kushiya K., et al: "Development of Cu(InGa)Se$_2$ Thin–Film Solar Cells with Zn–Compound Buffer", 13th European Photovoltaic Solar Energy Conference Proceedings, Oct. 23–27, 1995, pp. 2016–2019, XP002092401.

Neelkanth, G. D. and Lynn, K. W.: "Gallium Content Enhancement in CuInp$_{1-x}$Ga$_x$Se$_2$ Thin Films Prepared by Two–Selenizations Process Using Se Vapor", Twenty Fifth IEEE Photovoltaic Specialists Conference Proceedings, May 13–17, 1996, pp. 897–900, XP002092407.

Katsumi Kushiya et al., *25th IEEE Photovoltaics Specialists Conference,* "The Role of Cu(InGa)(SeS)$_2$ Surface Layer On A Graded Band–Gap Cu(InGa)Se$_2$ Thin–Film Solar Cell Prepared By Two–Stage Method".

*Primary Examiner*—Nam Nguyen
*Assistant Examiner*—Julian A. Mercado
*Attorney, Agent, or Firm*—Sughrue, Mion, Zinn, Macpeak & Seas, PLLC

[57] ABSTRACT

A thin-film light absorbing layer which is regulated so as to have any desired gallium concentration and which is capable of attaining a high open-circuit voltage is formed by a simple method at a temperature lower than the softening point of the soda-lime float glass. A light absorbing layer is formed by forming a back electrode on a soda-lime float glass substrate, forming on the back electrode layer a stacked precursor film including a copper-gallium alloy layer and an indium layer by sputtering, and then heating the precursor film in an atmosphere of selenium and/or sulfur.

4 Claims, 7 Drawing Sheets

- • : Cu-Ga ALLOY TARGET WITH Ga CONTENT OF 10 wt% (1) AND In TARGET (3).

- △ : Cu-Ga ALLOY TARGET WITH Ga CONTENT OF 20 wt% (1) AND In TARGET (3).

- ○ : Cu-Ga ALLOY TARGET WITH Ga CONTENT OF 30 wt% (1) AND In TARGET (3).

- • : Cu-Ga ALLOY TARGET WITH Ga CONTENT OF 20 wt%
  (1), Cu-Ga ALLOY TARGET WITH Ga CONTENT OF 10 wt%
  (2), AND In TARGET (3).

- △ : Cu-Ga ALLOY TARGET WITH Ga CONTENT OF 30 wt%
  (1), Cu-Ga ALLOY TARGET WITH Ga CONTENT OF 10 wt%
  (2), AND In TARGET (3).

- ○ : Cu-Ga ALLOY TARGET WITH Ga CONTENT OF 30 wt%
  (1), Cu-Ga ALLOY TARGET WITH Ga CONTENT OF 20 wt%
  (2), AND In TARGET (3).

- • : Cu-Ga ALLOY TARGET WITH Ga CONTENT OF 20 wt% (1), Cu-Ga ALLOY TARGET WITH Ga CONTENT OF 30 wt% (2), AND In TARGET (3).

- △ : Cu-Ga ALLOY TARGET WITH Ga CONTENT OF 10 wt% (1), Cu-Ga ALLOY TARGET WITH Ga CONTENT OF 30 wt% (2), AND In TARGET (3).

- ○ : Cu-Ga ALLOY TARGET WITH Ga CONTENT OF 10 wt% (1), Cu-Ga ALLOY TARGET WITH Ga CONTENT OF 20 wt% (2), AND In TARGET (3).

METHOD FOR PRODUCING THIN-FILM SOLAR CELL AND EQUIPMENT FOR PRODUCING THE SAME

FIELD OF THE INVENTION

The present invention relates to a method for producing a thin-film solar cell employing a thin film of a multi-element compound semiconductor as a light absorbing layer, more particularly a thin-film solar cell which contains a thin-film light absorbing layer comprising a multi-element compound semiconductor of the Cu-III-VI$_2$ chalcopyrite structure, e.g., a p-type semiconductor such as copper indium gallium diselenide (CIGS), and has a p-n heterojunction.

BACKGROUND OF THE INVENTION

Thin-film solar cells of the above-described crystal structure have possibilities for extensive practical use, as described in U.S. Pat. No. 4,335,226 (issued to Michelsen et al. on Jun. 15, 1982). Disclosed in the U.S. patent document cited above are a method for producing a light absorbing layer consisting of a single phase of CuInSe$_2$ (CIS) having a homogeneous structure and a method for producing a thin-film solar cell employing the light absorbing layer and having a high conversion efficiency.

Such thin-film solar cells having a high conversion efficiency are disclosed in, e.g., U.S. Pat. Nos. 4,798,660 (issued to J. H. Ermer et al.) and 4,915,745 (issued to G. A. Pollock et al.); C. L. Jensen et al., *Proceedings 23rd Photovoltaic Specialists Conference,* (1993), p. 577; and JP-A-4-326526 (Mitsune et al.). (The term "JP-A" as used herein means an "unexamined published Japanese patent application.")

U.S. Pat. No. 4,798,660 discloses a method for forming a thin-film light absorbing layer consisting of a CIS single phase having a uniform composition, which comprises depositing a metallic back electrode layer, a layer of pure copper alone, and a layer of pure indium alone in this order by DC magnetron sputtering to form a stacked thin metallic film and then reacting the stacked metallic film with selenium by exposing the same to a selenium atmosphere, desirably an H$_2$Se gas atmosphere.

U.S. Pat. No. 4,915,745 discloses a technique for improving the performance of a thin-film solar cell by forming a stacked precursor film comprising a copper-gallium alloy layer containing gallium and a layer of pure indium and then heating the precursor film in a selenium atmosphere to form a light absorbing layer, whereby gallium segregates and migrates to the metallic back electrode layer of molybdenum (Mo) during the heat treatment to function as a kind of adhesive to improve adhesion between the metallic back electrode layer and the resulting thin-film light absorbing layer.

C. L. Jensen et al. suggested in the reference cited above that the CIS light absorbing layer formed by heating a stacked precursor film comprising a copper-gallium alloy layer containing gallium and a layer of pure indium in a selenium atmosphere has improved adhesion to the metallic back electrode layer of molybdenum (Mo) because of the segregation of gallium and migration thereof to the metallic back electrode layer during the heat treatment, and that there is the possibility that the light absorbing layer formed has an internal structure having a gallium concentration gradient and made up of two layers, i.e., a Cu(InGa)Se$_2$ layer and a CIS layer, based on the results of Auger electron spectroscopy (AES).

JP-A-4-326526 discloses a method for producing a thin film consisting only of a single phase of copper indium gallium diselenide sulfide which comprises forming a molybdenum layer on a Corning 7059 (trade name of Corning Inc.) glass substrate by sputtering, subsequently forming thereon a stacked film consisting of copper, indium, and sulfur by vapor deposition, heating the stacked film in a nitrogen atmosphere to form a thin film consisting of a single phase of copper indium gallium disulfide, and then introducing H$_2$Se gas into the same oven to convert the thin film to the desired one. There is a description in the above reference to the effect that a thin film consisting of a single phase of copper indium gallium diselenide sulfide having the same performance can also be obtained by a method which is the same as the above, except that selenium is used in place of sulfur and that H$_2$S gas is used in place of H$_2$Se gas as the atmosphere for heat treatment.

For producing a thin-film light absorbing layer made of a Cu-III-VI$_2$ chalcopyrite semiconductor, e.g., a p-type semiconductor such as copper indium diselenide (CIS) or copper indium gallium diselenide (CIGS), coevaporation technique may be used which employs solid starting materials for these constituent elements. Since this coevaporation technique has an advantage that the content of gallium in the thin-film light absorbing layer can be freely regulated in the range of from 0 to 100 at. %, the optimum bandgap of 1.3 to 1.5 eV is attainable which is desirable to obtain better match with the air mass (AM) 1.5 solar spectrum changing the fractional Ga content in Cu(InGa)Se$_2$ (CIGS) thin films. However, it has problems that production of a large-area thin-film solar cell is not easy because of the structure of the production equipment, and that the technique is unsuitable for mass production.

Furthermore, when a CIGS single phase is formed in a high gallium content, it is preferred to use a substrate having temperature not lower than the softening point of the soda-lime float glass, which is an inexpensive substrate generally employed, so that treatment at a higher temperature can be conducted for accelerating the diffusion of gallium. However, use of such a high substrate temperature poses problems of, for example, deformation of the soda-lime float glass, generation of unfavorable phases caused by the diffusion of an alkali ingredient from the glass into the CIGS phase, impaired reproducibility because of difficulties in diminishing the diffusion, and peeling of the thin-film light absorbing layer consisting of a CIGS single phase from the Mo back-electrode layer.

SUMMARY OF THE INVENTION

The present invention has been achieved in order to eliminate the problems described above.

An object of the present invention is to form a thin-film light absorbing layer by a relatively simple method at a temperature lower than the softening point of a soda-lime float glass while regulating the concentration of Group III elements (gallium and indium) in the thin-film light absorbing layer to any desired value to thereby realize a thin-film solar cell having a high open-circuit voltage.

Another object of the present invention is to prevent the thin-film light absorbing layer from peeling off other layers.

To accomplish the above objects, the present invention provides:

a method for producing a thin-film light absorbing layer for a thin-film solar cell which comprises forming a stacked precursor film comprising a copper-gallium alloy layer and an indium layer on a metallic back electrode layer by sputtering and then heating the precursor film in an atmosphere of selenium and/or sulfur to thereby form a light absorbing layer comprising a multi-element compound semiconductor of the Cu-III-VI$_2$ chalcopyrite structure, the stacked precursor film which comprises a copper-gallium alloy layer and an indium layer being formed by depositing the copper-gallium alloy layer and the indium layer in this order on the metallic back electrode layer by sputtering, the thin-film light absorbing layer having such a gallium concentration gradient that the concentration of gallium in the light absorbing layer increases from the side closer to an interfacial layer (buffer layer) to the side closer to the metallic back electrode layer;

a method for producing a thin-film light absorbing layer for a thin-film solar cell as described above, wherein the gallium concentration gradient in the thin-film light absorbing layer, in which the concentration of gallium increases from the interfacial layer (buffer layer) side to the side of the metallic back electrode layer, is obtained by forming the stacked precursor film comprising a copper-gallium alloy layer and an indium layer by sputtering in such a manner that the structure (composition) of the copper-gallium alloy layer is changed and then heating this precursor film in an atmosphere of selenium and/or sulfur;

a method for producing a thin-film light absorbing layer for a thin-film solar cell as described above, wherein the gallium concentration gradient in the thin-film light absorbing layer, in which the concentration of gallium increases from the interfacial layer (buffer layer) side to the side of the metallic back electrode layer, is obtained by forming the stacked precursor film comprising a copper-gallium alloy layer and an indium layer by depositing a copper-gallium alloy layer having a high gallium content, a copper-gallium alloy layer having a low gallium content, and an indium layer in this order on the metallic back electrode layer by sputtering, and then heating this precursor film in an atmosphere of selenium and/or sulfur;

a method for producing a thin-film light absorbing layer for a thin-film solar cell as described above, wherein the gallium concentration gradient in the thin-film light absorbing layer, in which the concentration of gallium increases from the interfacial layer (buffer layer) side to the side of the metallic back electrode layer, is obtained by forming the stacked precursor film comprising a copper-gallium alloy layer and an indium layer by depositing a copper-gallium alloy layer having a low gallium content, a copper-gallium alloy layer having a high gallium content, and an indium layer in this order on the metallic back electrode layer by sputtering, and then heating this precursor film in an atmosphere of selenium and/or sulfur;

a method for producing a thin-film light absorbing layer for a thin-film solar cell which comprises forming on a metallic back electrode layer a stacked precursor film comprising a layer of a copper-gallium alloy and an indium layer by sputtering using copper-gallium alloy targets having different gallium contents (the gallium content in each copper-gallium alloy being from 1 to 40% by weight) including a pure copper target and an indium (or indium-selenium alloy) target, and then heating the precursor film in an atmosphere of selenium and/or sulfur to thereby form a thin film of a multi-element compound semiconductor of the Cu-III-VI$_2$ chalcopyrite structure;

an equipment for producing a thin-film light absorbing layer for a thin-film solar cell, the equipment comprising a sputtering part for forming a stacked precursor film comprising a layer of a copper-gallium alloy and an indium layer on a metallic back electrode layer formed on a glass substrate, and further comprising a part for heating in a selenium gas atmosphere the stacked precursor film formed in the sputtering part and/or a part for heating the stacked precursor film in a sulfur atmosphere; and an equipment for producing a thin-film light absorbing layer for a thin-film solar cell, wherein the sputtering part has at least one copper-gallium alloy target and optionally a copper target, the targets having different gallium contents when more than one target is used, and an indium (or indium-selenium alloy) target (the gallium content in each copper-gallium alloy being from 1 to 40%).

DETAILED DESCRIPTION OF THE INVENTION

Modes for carrying out the present invention are explained below by reference to drawings.

Important features of the present invention reside in the method for producing a thin-film light absorbing layer serving as the central part of a thin-film solar cell of the Cu-III-VI$_2$ chalcopyrite structure. It is noted that the term "Cu-III-VI$_2$" means Cu-[Group III elements]-[Group VI element(s)]$_2$.

The method for producing a thin-film solar cell, more specifically for producing a thin-film light absorbing layer for a thin-film solar cell, is described below in detail.

Figure 1:
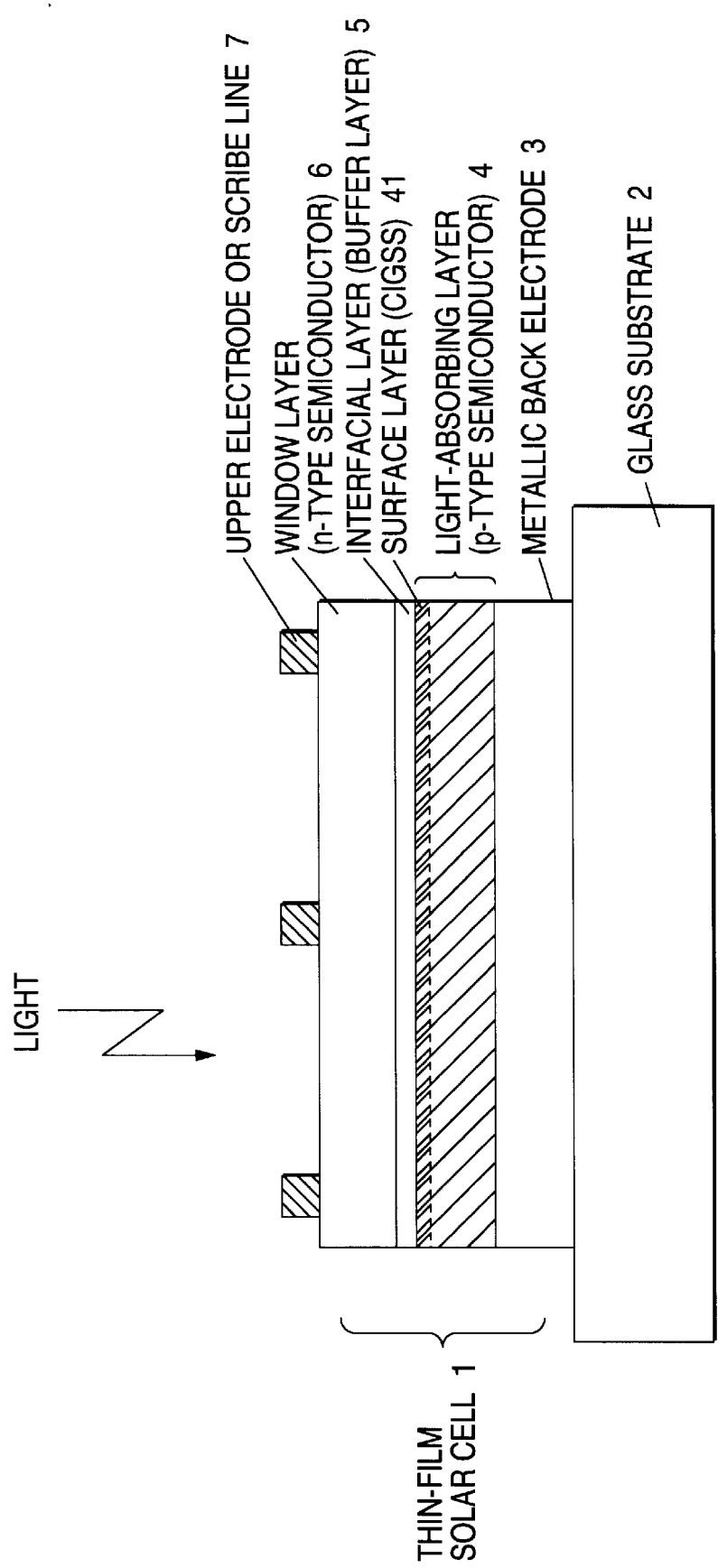
FIG. 1 is a sectional view of a thin-film solar cell according to the present invention.
Figure 2:
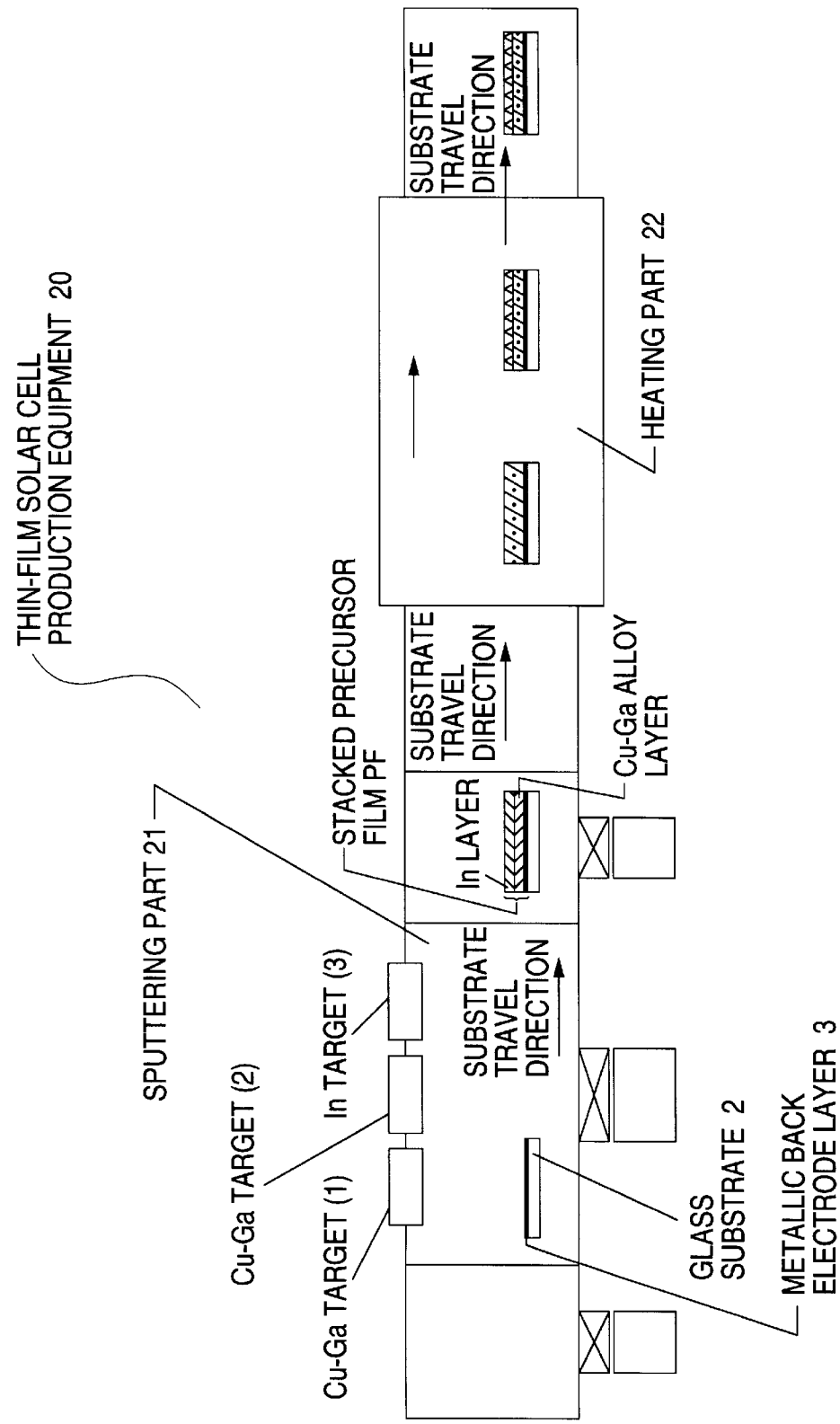
FIG. 2 is a view illustrating a thin-film solar cell production equipment for use in the method of the present invention for producing a thin-film solar cell.

The method of the present invention is explained below by reference to FIG. 1, which illustrates a thin-film solar cell 1 produced by the method of the present invention, and FIG. 2, which illustrates an equipment for producing a thin-film solar cell.

On a glass substrate 2 comprising, e.g., a soda-lime float glass is formed a metallic back electrode layer 3. This substrate is introduced into a sputtering part 21 of the thin-film solar cell production equipment 20 shown in FIG. 2, where a stacked precursor film PF comprising a layer of a copper-gallium alloy and an indium layer and having any of the structures (a) to (c) described below is formed on the metallic back electrode layer 3 by sputtering using a target (1) consisting of a copper-gallium alloy (or copper), a target (2) consisting of a copper-gallium alloy (or copper), and a target consisting of indium (or an indium-selenium alloy) (the gallium content in each copper-gallium alloy is in the range of from 1 to 40%). This precursor film PF is heated in an atmosphere of selenium and/or sulfur to thereby produce a thin-film light absorbing layer 4 having a surface layer including sulfur (CIGSS) 41. In FIG. 2, the heating part 22 shows an electric furnace which enables heat treatment introducing a reactive gas at temperature of not higher than 600° C.

The stacked precursor film formed on the metallic back electrode layer 3 can have any of the following three structures (a) to (c).

(a) A stacked precursor film consisting of a copper-gallium alloy layer and a pure indium layer disposed in this order from the side of the metallic back electrode layer 3.

(b) A stacked precursor film consisting of a copper-gallium alloy layer having a high gallium content, a copper-gallium alloy layer having a low gallium content, and a pure indium layer disposed in this order from the side of the metallic back electrode layer 3.

(c) A stacked precursor film consisting of a copper-gallium alloy layer having a low gallium content, a copper-gallium alloy layer having a high gallium content, and a pure indium layer disposed in this order from the side of the metallic back electrode layer 3.

A thin-film layer of a Group II-VI semiconductor which may contain a transparent hydroxide with high resistance (e.g., Zn(O, S, OH)$_x$) is deposited as an interfacial layer (or buffer layer) 5 on the thin-film light absorbing layer 4. On this interfacial layer 5 is deposited a window layer 6 consisting of a thin metallic semiconductor film which is transparent, has electrical conductivity, and has n-type conductivity with wide bandgap (e.g., ZnO containing boron or aluminum as a dopant). Thereafter, an upper electrode or scribe lines 7 are formed thereon to fabricate a thin-film solar cell or module 1.

In the present invention, the metallic back electrode layer, the light absorbing layer, the buffer layer, and the window layer which constitute the solar cell each has a film thickness of from 5,000 to 15,000 Å, from 10,000 to 30,000 Å, from 100 to 1,000 Å, and from 5,000 to 20,000 Å, respectively.

Figure 3:
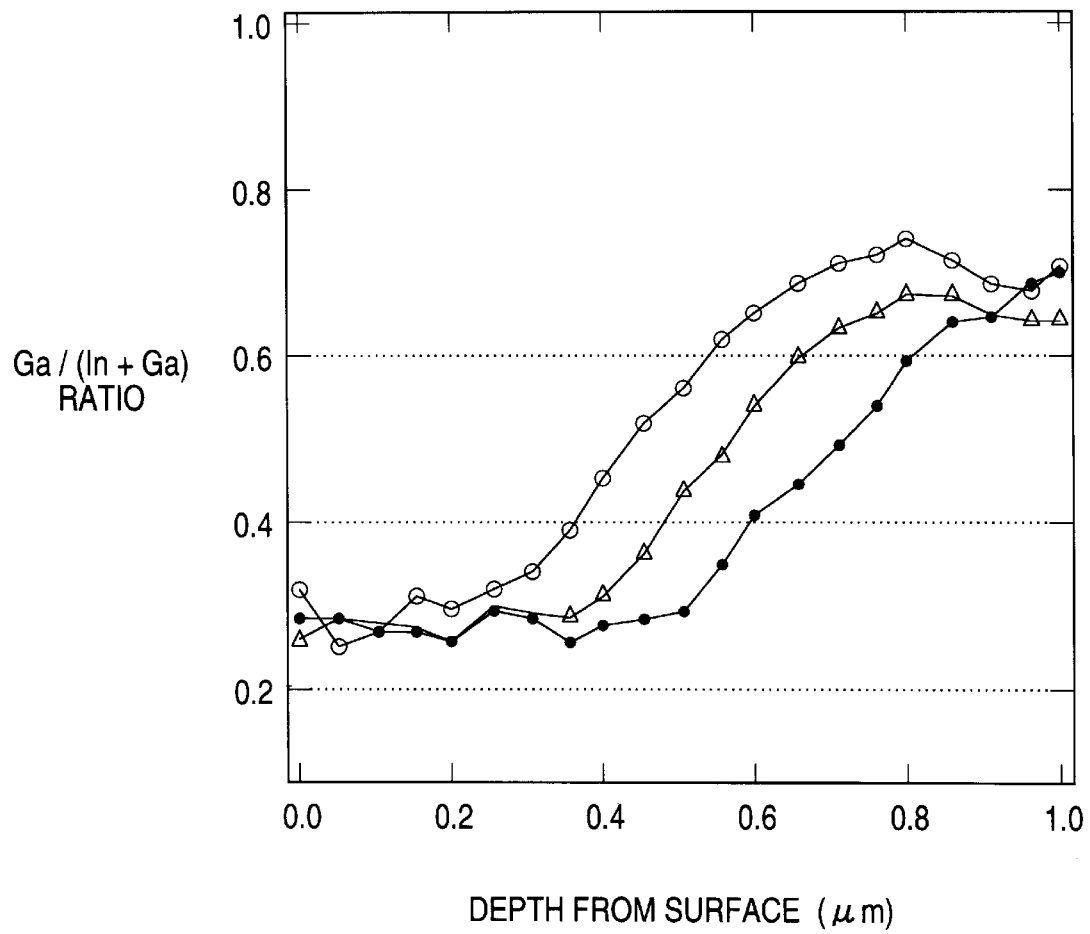
FIG. 3 is a graphical presentation illustrating the results of Auger electron spectroscopy (AES) of the distribution of the concentration of Group III elements (indium and gallium) in thin-film CIGS light absorbing layers for a thin-film solar cell, which layers had been formed in the method of the present invention from stacked precursor films having the structure (a), consisting of a copper-gallium alloy layer and an indium layer disposed in this order from the side of the metallic back electrode layer 3.
Figure 4:
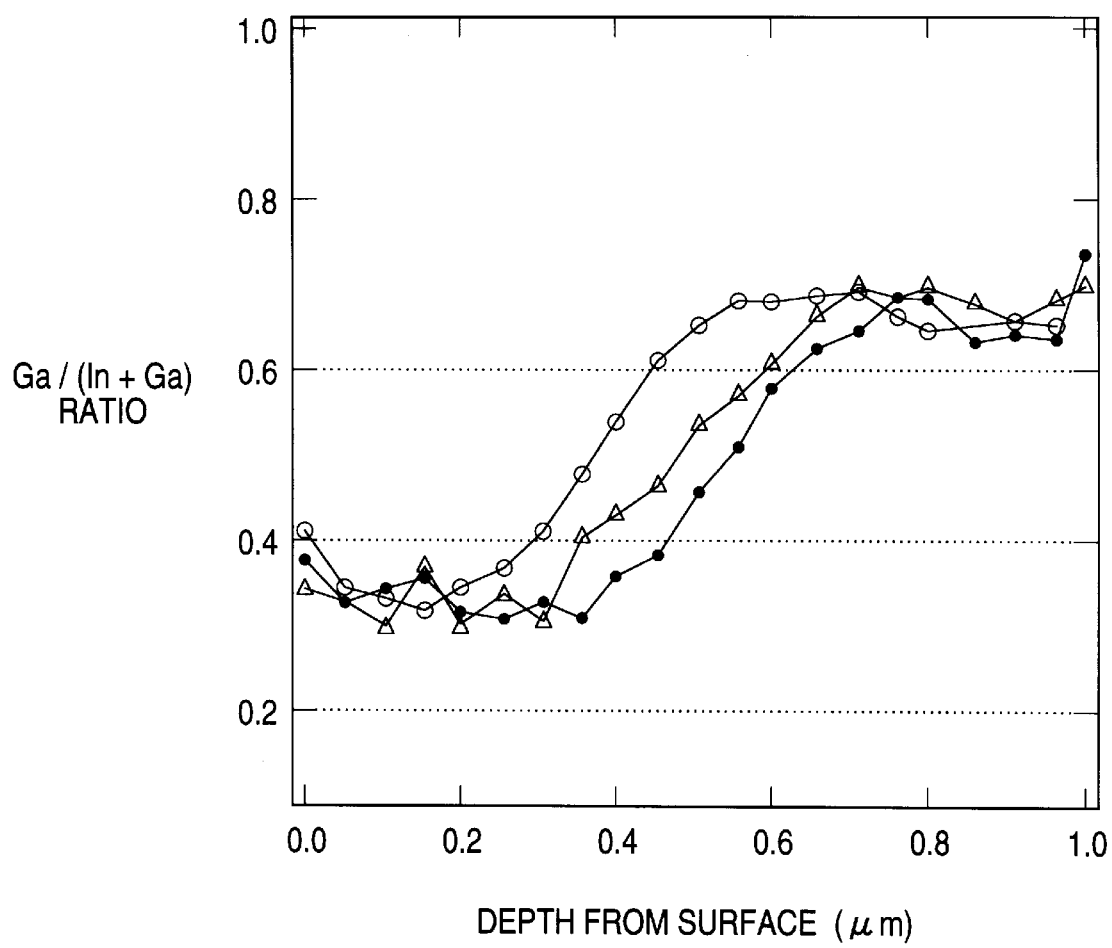
FIG. 4 is a graphical presentation illustrating the results of Auger electron spectroscopy (AES) of the distribution of the concentration of Group III elements (indium and gallium) in thin-film CIGS light absorbing layers for a thin-film solar cell, which layers had been formed in the method of the present invention from stacked precursor films having the structure (b), consisting of a copper-gallium alloy layer having a high gallium content, a copper-gallium alloy layer having a low gallium content, and an indium layer disposed in this order from the side of the metallic back electrode layer 3.
Figure 5:
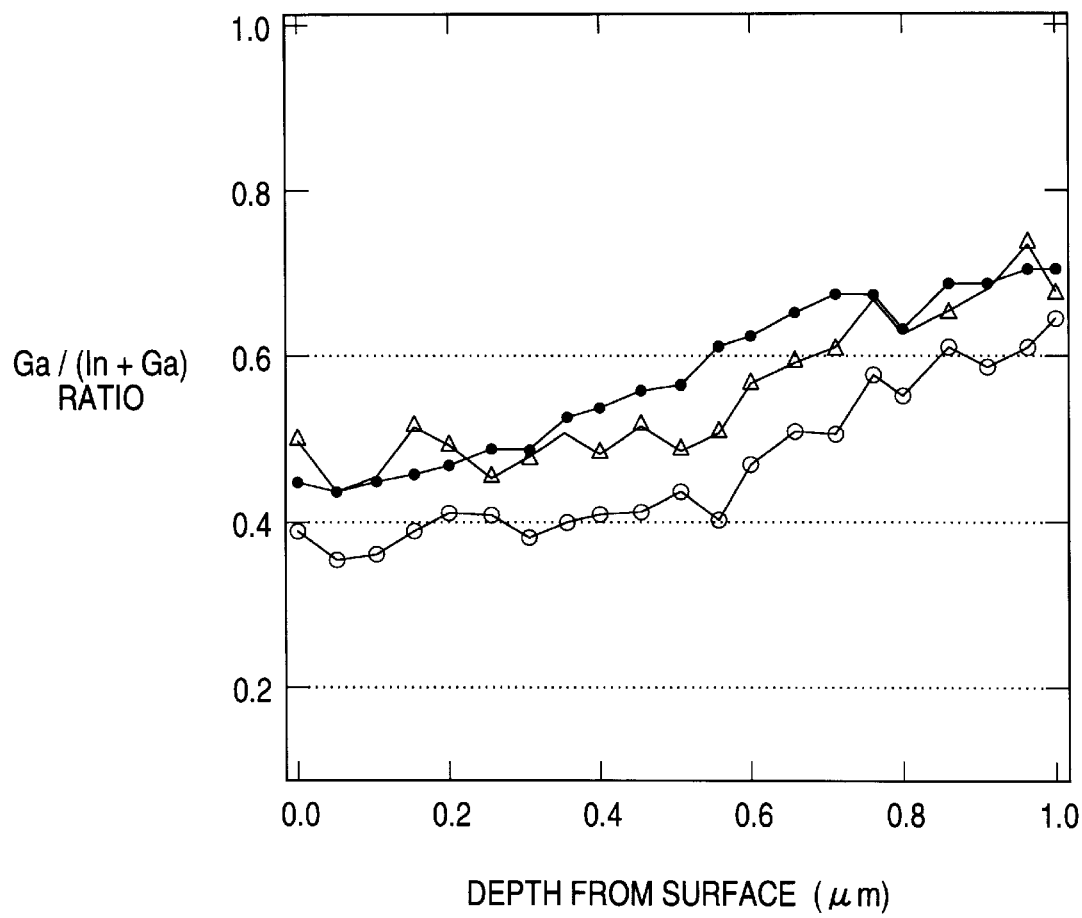
FIG. 5 is a graphical presentation illustrating the results of Auger electron spectroscopy (AES) of the distribution of the concentration of Group III elements (indium and gallium) in thin-film CIGS light absorbing layers for a thin-film solar cell, which layers had been formed in the method of the present invention from stacked precursor films having the structure (c), consisting of a copper-gallium alloy layer having a low gallium content, a copper-gallium alloy layer having a high gallium content, and an indium layer disposed in this order from the side of the metallic back electrode layer 3.

According to the method described above which comprises the steps of forming a stacked precursor film by sputtering and heating the precursor film in an atmosphere of at least one of selenium and sulfur, the thin film of a multi-element compound semiconductor of the Cu-III-VI$_2$ chalcopyrite structure (copper indium gallium diselenide (CIGS)), which is the first thin film of a p-type semiconductor for use as a thin-film light absorbing layer, can be regulated so as to have any desired gradient of the concentration of the Group III elements (indium and gallium) therein. For example, as shown in FIGS. 3 to 5, the thin-film light absorbing layer can be regulated so as to have such a gallium concentration gradient that the gallium concentration in the layer gradationally (gradually) increases from the interfacial layer (buffer layer) side to the side of the metallic back electrode layer. Alternatively, the light absorbing layer can be regulated so as to have almost the same gallium concentration throughout the layer.

Thin-film CIGS light absorbing layers 4 obtained by the method described above were analyzed for gallium concentration distribution, specifically for the distribution of the ratio of gallium to gallium plus indium, by Auger electron spectroscopy (AES). The results of this analysis are shown in FIGS. 3 to 5.

FIG. 3 shows the results for the light absorbing layers formed from stacked precursor films which have the structure (a) described above, that is, which each consists of a copper-gallium alloy layer and an indium layer disposed in this order from the side of the metallic back electrode layer 3. More particularly, indicates the light absorbing layer formed from a precursor film formed by sputtering using a copper-gallium alloy target having a gallium content of 10% by weight (1) and an indium target (3); Δ indicates that layer formed from a precursor film formed by sputtering using a copper-gallium alloy target having a gallium content of 20% by weight (1) and an indium target (3); and ○ indicates that layer formed from a precursor film formed by sputtering using a copper-gallium alloy target having a gallium content of 30% by weight (1) and an indium target (3).

FIG. 4 shows the results for the light absorbing layers formed from stacked precursor films which have the structure (b) described above, that is, which each consists of a copper-gallium alloy layer having a high gallium content, a copper-gallium alloy layer having a low gallium content, and an indium layer disposed in this order from the side of the metallic back electrode layer 3. More particularly, ● indicates the light absorbing layer formed from a stacked precursor film formed by sputtering using a copper-gallium alloy target having a gallium content of 20% by weight (1), a copper-gallium alloy target having a gallium content of 10% by weight (2), and an indium target (3); Δ indicates that layer formed from a stacked precursor film formed by sputtering using a copper-gallium alloy target having a gallium content of 30% by weight (1), a copper-gallium alloy target having a gallium content of 10% by weight (2), and an indium target (3); and ○ indicates that layer formed from a stacked precursor film formed by sputtering using a copper-gallium alloy target having a gallium content of 30% by weight (1), a copper-gallium alloy target having a gallium content of 20% by weight (2), and an indium target (3).

FIG. 5 shows the results for the light absorbing layers formed from stacked precursor films which have the structure (c) described above, that is, which each consists of a copper-gallium alloy layer having a low gallium content, a copper-gallium alloy layer having a high gallium content, and an indium layer disposed in this order from the side of the metallic back electrode layer 3. More particularly, ● indicates the light absorbing layer formed from a stacked precursor film formed by sputtering using a copper-gallium alloy target having a gallium content of 20% by weight (1), a copper-gallium alloy target having a gallium content of 30% by weight (2), and an indium target (3); ▲ indicates that layer formed from a stacked precursor film formed by sputtering using a copper-gallium alloy target having a gallium content of 10% by weight (1), a copper-gallium alloy target having a gallium content of 30% by weight (2), and an indium target (3); and ○ indicates that layer formed from a stacked precursor film formed by sputtering using a copper-gallium alloy target having a gallium content of 10% by weight (1), a copper-gallium alloy target having a gallium content of 20% by weight (2), and an indium target (3).

The results of the analysis given above show that the light absorbing layer can be regulated so as to have any desired gradient of the concentration of Group III elements (indium and gallium) therein by suitably selecting target materials and the sequence of layer deposition in precursor film formation.

Figure 6:
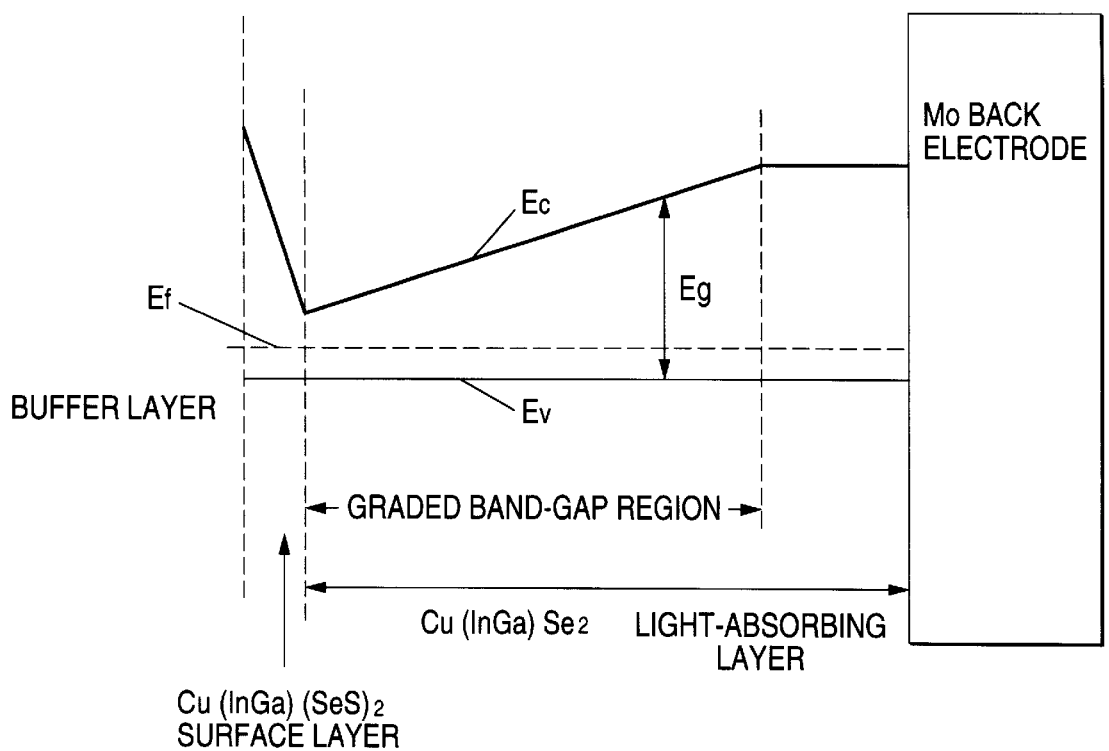
FIG. 6 is a schematic view illustrating the structure of the graded band-gap region of the thin-film light absorbing layer of a thin-film solar cell according to the present invention.

FIG. 6 is a schematic view illustrating the structure of the bandgap of a thin-film light absorbing layer 4 for a thin-film solar cell 1, which layer was obtained by the method of the present invention and provided the analysis results for which are shown in FIG. 3.

According to the method of the present invention for producing a thin-film solar cell, a thin-film CIGS light absorbing layer is formed which has a wide bandgap as shown in the schematic view.

Figure 7:
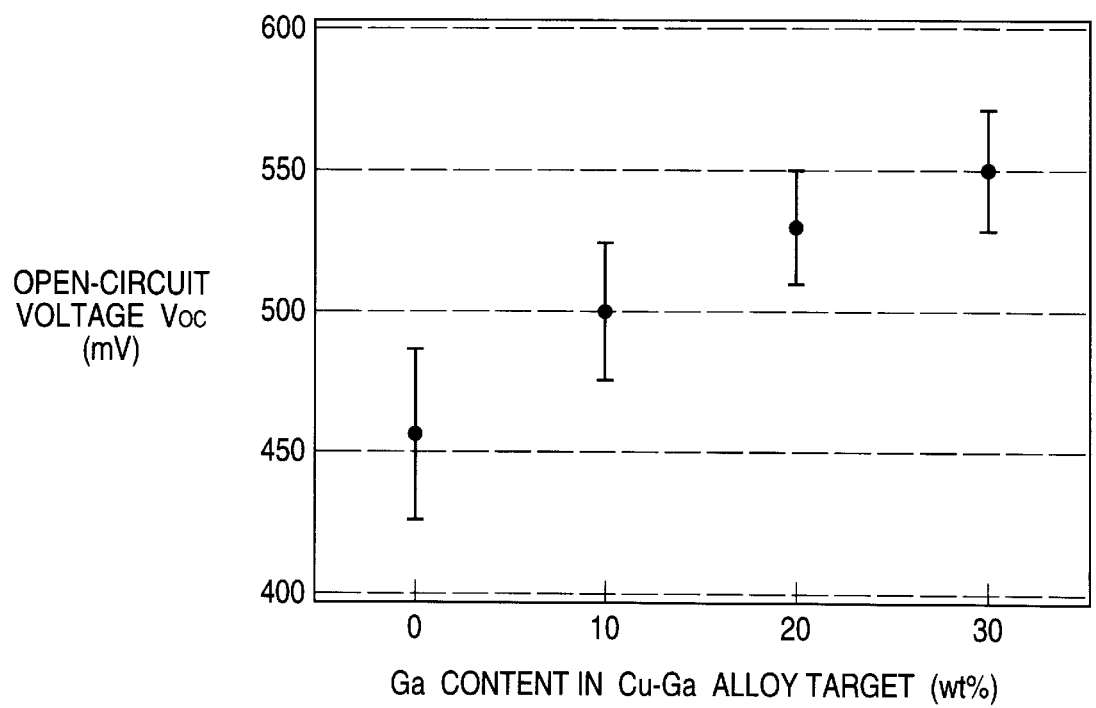
FIG. 7 is a graphical presentation illustrating the relationship between the content of gallium (wt %) in copper-gallium alloy targets and open-circuit voltage $V_{oc}$ (mV) in a thin-film solar module (an aperture area of 50 cm$^2$) produced according to the present invention using a stacked precursor film having the structure (a), consisting of a copper-gallium alloy layer and an indium layer disposed in this order from the side of the metallic back electrode layer 3; that relationship was determined with a solar simulator under the standard measurement conditions of air mass (AM) 1.5 and 100 mW/cm$^2$.

FIG. 7 shows the relationship between the content of gallium (wt %) in copper-gallium alloy targets and open-circuit voltage $V_{oc}$ (mV) in thin-film solar cells 1 employing a CIGS light absorbing layer 4 having a gallium concentration gradient such as those shown in FIG. 3. The results given in the figure were obtained with a solar simulator with respect to a thin-film solar module having an aperture area of 50 cm$^2$ under the standard measurement conditions of air mass (AM) 1.5 and 100 mW/cm$^2$. The results obtained show that high open-circuit voltages $V_{oc}$ exceeding 500 mV can be obtained, which are comparable to those of polycrystalline-silicon solar cells.

As described above, a thin-film light absorbing layer serving as the central part of a solar cell of the Cu-III-VI$_2$ chalcopyrite structure can be produced by the simple method of the present invention in which a stacked precursor film is formed by an ordinary sputtering technique and then is heated in an atmosphere of selenium and/or sulfur.

Furthermore, in the method of the present invention, the heat treatment in an atmosphere of selenium and/or sulfur for producing the thin film of a multi-element compound semiconductor of the Cu-III-VI$_2$ chalcopyrite structure, which is the first thin film of a p-type semiconductor for use as a thin-film light absorbing layer, can be performed at a lower temperature as compared with prior art methods. Since the temperature used in the present invention is lower than the softening point of the soda-lime float glass, the following effects are obtained.
(1) Substrate deformation can be prevented, resulting in an improved product yield and a reduced production cost.
(2) Since a soda-lime float glass substrate can be used, production cost and the cost of energy required for the production can be reduced.

While the invention has been described in detail and with reference to specific embodiments thereof, it will be apparent to one skilled in the art that various changes and modifications can be made therein without departing from the spirit and scope thereof.

What is claimed is:

1. A method for producing a thin-film light absorbing layer for a thin-film solar cell which comprises forming a stacked precursor film comprising a copper-gallium alloy layer and an indium layer on a metallic back electrode layer by sputtering, and then heating the precursor film in an atmosphere of at least one of selenium and sulfur to thereby form a light absorbing layer comprising a Cu-III-VI$_2$ chalcopyrite multi-element compound semiconductor, wherein said stacked precursor film which comprises a copper-gallium alloy layer and an indium layer is formed by depositing the copper-gallium alloy layer and the indium layer in this order on the metallic back electrode layer by sputtering using (1) copper-gallium alloy targets having different gallium contents, with the gallium content in each copper-gallium alloy target being from 1 to 40% by weight and (2) an indium or indium-selenium alloy target, wherein said thin-film light absorbing layer has a side closest to the metallic back electrode layer and a side closest to an interfacial layer in the solar cell and has a gallium concentration gradient that increases from the side closest to the interfacial layer to the side closest to the metallic back electrode layer.

2. The method for producing a thin-film light absorbing layer for a thin-film solar cell as claimed in claim 1, wherein the gallium concentration gradient in the thin-film light absorbing layer is obtained by forming the stacked precursor film comprising a copper-gallium alloy layer and an indium layer by sputtering in such a manner that the structure of the copper-gallium alloy layer is changed and then heating the precursor film in an atmosphere of at least one of selenium and sulfur.

3. The method for producing a thin-film light absorbing layer for a thin-film solar cell as claimed in claim 1, wherein the gallium concentration gradient in the thin-film light absorbing layer is obtained by forming the stacked precursor film comprising a copper-gallium alloy layer and an indium layer by depositing a copper-gallium alloy layer having a high gallium content, a copper-gallium alloy layer having a low gallium content, and an indium layer in this order on the metallic back electrode layer by sputtering, and then heating the precursor film in an atmosphere of at least one of selenium and sulfur.

4. The method for producing a thin-film light absorbing layer for a thin-film solar cell as claimed in claim 1, wherein the gallium concentration gradient in the thin-film light absorbing layer is obtained by forming the stacked precursor film comprising a copper-gallium alloy layer and an indium layer by depositing a copper-gallium alloy layer having a low gallium content, a copper-gallium alloy layer having a high gallium content, and an indium layer in this order on the metallic back electrode layer by sputtering, and then heating this precursor film in an atmosphere of at least one of selenium and sulfur.

* * * * *